United States Patent
Chung

(10) Patent No.: US 7,126,864 B2
(45) Date of Patent: Oct. 24, 2006

(54) MEMORY DEVICE CAPABLE OF CHANGING DATA OUTPUT MODE

(75) Inventor: Jun Seop Chung, Seoul (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 11/131,544

(22) Filed: May 17, 2005

(65) Prior Publication Data

US 2006/0109724 A1 May 25, 2006

(30) Foreign Application Priority Data

Nov. 19, 2004 (KR) ...................... 10-2004-0095368

(51) Int. Cl.
*G11C 7/00* (2006.01)

(52) U.S. Cl. ............... 365/200; 365/189.07; 365/225.7

(58) Field of Classification Search ................ 365/200, 365/189.07, 225.7
See application file for complete search history.

(56) References Cited

U.S. PATENT DOCUMENTS

| 5,519,657 | A | * | 5/1996 | Arimoto | ..................... | 365/200 |
| 6,141,282 | A | * | 10/2000 | Chin et al. | ............... | 365/225.7 |
| 6,246,623 | B1 | * | 6/2001 | Ingalls | ..................... | 365/225.7 |
| 6,909,646 | B1 | * | 6/2005 | Hasegawa et al. | .......... | 365/200 |

* cited by examiner

*Primary Examiner*—Huan Hoang
(74) *Attorney, Agent, or Firm*—Townsend and Townsend and Crew LLP

(57) ABSTRACT

Disclosed herein is a memory device capable of changing data output modes. According to the present invention, an address that is input to a circuit, which is designed in 8-bit output mode, is internally modified, to operate in 16-bit output mode, and a test operation is performed in 8-bit output mode. As such, two kinds of output mode circuits can be tested in one test equipment. Accordingly, test efficiency can be enhanced and costs can be saved.

25 Claims, 4 Drawing Sheets

MEMORY DEVICE CAPABLE OF CHANGING DATA OUTPUT MODE

CROSS-REFERENCES TO RELATED APPLICATIONS

This application claims priority to Korean Application No. 10-2004-0095368, filed Nov. 19, 2004, which is incorporated herein by reference for all purposes.

BACKGROUND OF THE INVENTION

1. Field of the Invention

The present invention relates to a memory device capable of changing data output modes, and more specifically, to a memory device capable of changing data output modes, wherein a flash memory designed in a 16-bit output mode can be tested in an 8-bit output mode.

2. Discussion of Related Art

Generally, a memory device includes a cell array and a redundancy array. If a fail column occurs, it is replaced with a normal column included in the redundancy array.

FIG. 1 is a simplified block diagram of a conventional memory device having a redundancy cell array.

Referring to FIG. 1, the memory device includes a cell array 110, a redundancy array 120, a sense amplifier 130, an address buffer 140, a fail bit detector 150 and an I/O multiplexer 160.

The cell array 110 has a plurality of memory cells. A memory cell connected to a corresponding word line and a bit line is selected according to an input address signal. Cell array 110 is divided into 16 blocks. 16 data bits are output from the cells respectively selected from the 16 blocks according to the address signal. In the case of 32 bits, the cell array 110 could be divided into 32 blocks, where 32 data bits are output. Hereinafter, a case where 16 data bits are output will be described as an example.

The redundancy array 120 includes a plurality of repair cells. The array outputs repair data RDL, which will substitute data bits output from the fail cell included in cell array 110, according to the address signal.

For example, if an address signal is input, 16 data bits (i.e., DL0 to DL15) are output from the cell array 110, and the repair data RDL are output from the redundancy array 120.

The data bits DL0 to DL15, and RDL are input to the I/O multiplexer 160. The I/O multiplexer 160 transfers the data bits DL0 to DL15, and RDL to a pad PAD through I/O lines IO[15:0]. I/O multiplexer 160 also determines which data bits DL0 to DL15 in a received address is in error, according to fail bit signals RIO[3:0] of the fail bit detector 150, and outputs the repair data RDL substituting the data bits that are in error.

Fail bit detector 150 determines whether a fail cell is selected in a corresponding address if address signals A[n:0] are received from the address buffer 140, and then outputs the fail bit signals RIO[3:0], which indicate which data bits DL0 to DL15 are in error, to the I/O multiplexer 160.

More details regarding the operation of the fail bit detector 150 will be described below.

FIG. 2 is a simplified circuit diagram showing the fail bit detector shown in FIG. 1.

Referring to FIG. 2, the fail bit detector includes an address comparator 151 and a fail bit signal generator 152. The address comparator 151 and the fail bit signal generator 152 complement (i.e., match) the number of column bit lines included in the redundancy array 120 of FIG. 1.

Address comparator 151 includes a switch comprising a transistor and a fuse, which are connected serially. The switch may be connected in pairs in a parallel manner to form a pair of a larger switching unit. A plurality of the switching units is connected between a power supply voltage terminal and a ground voltage terminal in a serial manner.

Address comparator 151 will be described in more detail. First switch Ta1 and Fa1 and second switch Tb1 and Fb1 in which a transistor and a fuse are serially connected are connected between a first node N0 (an output node) and a second node N1, thus forming one switching unit. A third switch (not shown) and fourth switch (not shown) in which a transistor and a fuse are serially connected are connected between the second node N1 and a third node (not shown) in a parallel manner, thereby forming a subsequent switching unit. The switches are repeatedly connected in pairs in a parallel manner between the respective nodes. $(2n-1)^{th}$ switch Tan and Fan, and $(2n)^{th}$ switch Tbn and Fbn are connected in a parallel manner between a last $(n-1)^{th}$ node Nn−1 and a $(n+1)^{th}$ node Nn+1, thereby forming the last switching unit. It should be appreciated that the number of switching units provided match the number of bits of an address signal.

Meanwhile, in order for the address comparator 151 to enable signals RENb and REN, a switching element PT1 that operates according to the enable signal RENb can be disposed between the power supply voltage terminal and the first node N0. A switching element NT1 that operates according to the enable signal REN can be disposed between the ground voltage terminal and the $(n+1)^{th}$ node Nn+1.

A plurality of fuses Fa1 to Fan, Fb1 to Fbn included in the address comparator 151 are selectively cut (the cutting state of the fuse is not shown) according to address information on which a fail cell is selected. Accordingly, the address for selecting the fail cell is stored. It should be appreciated that only one of two fuses included in each of the switching units is cut, but two fuses are not cut or connected together at the same time.

Furthermore, the address signals A[n:0] and inverted address signals Ab[n:0] are input to the address comparator 151. The address signals A[n:0] are respectively divided into bits, and are input to gates of transistors Ta1 to Tan included in the first, third, fifth, . . . , $(2n-3)^{th}$ and $(2n-1)^{th}$ switch, respectively. The inverted address signals Ab[n:0] respectively divided into bits, and are input to gates of transistors Tb1 to Tbn included in second, fourth, the sixth, . . . , $(2n-2)^{th}$ and $(2n)^{th}$ switch, respectively.

The address comparator 151 outputs repair enable signals RIOEN and RIOENb if the received address signals A[n:0] coincide with stored addresses. For example, if a fail cell is selected when the address signals A[n:0] are input as '11 . . . 110', only the fuses Fa1, Fb2 to Fbn corresponding to a low bit (i.e., 0) in the address signals are cut in advance. This operation stores a fail address. After the fail address is stored, if the address signals A[n:0] are input as '11 . . . 110', where the fuses Fb1, Fa2 to Fan corresponding to a high bit (i.e., 1) in the address signals are connected, the transistors Tb1, Ta2 to Tan which are serially connected to these fuses Fb1, Fa2 to Fan are all turned on. If such a match occurs (i.e., the address signals match the fail address), the first node N0 (the output terminal) is electrically connected to the ground voltage terminal, and the first and second repair enable signals RIOEN and RIOENb are output as High (i.e., 1) and Low (i.e., 0), respectively, through the first node N0.

When first and second repair enable signals RIOEN and RIOENb are generated, the fail bit signal generator 152 outputs the fail bit signals RIO[3:0] indicating which bits are in error.

Fail bit signal generator 152 includes a switching transistor PT2, which is connected to the power supply voltage terminal and operates according to the second repair enable signal RIOENb, first switch Tc1 and Fc1 connected between a switching transistor P1 (not shown) and a first output terminal, second switch Td1 and Fd1 connected between a ground voltage terminal and the first output terminal, third switch Tc2 and Fc2 connected between the switching transistor P1 and a second output terminal, fourth switch Td2 and Fd2 connected between the ground voltage terminal and the second output terminal, fifth switch Tc3 and Fc3 connected between the switching transistor P1 and a third output terminal, sixth switch Td3 and Fd3 connected between the ground voltage terminal and the third output terminal, seventh switch Tc4 and Fc4 connected between the switching transistor P1 and a fourth output terminal, and eighth switch Td4 and Fd4 connected between the ground voltage terminal and the fourth output terminal.

Four output terminals are implemented corresponding to a case where the output data consists of 16 bits. If the output data were output as 32 bits, another output terminal could be provided, along with two additional switches.

The switches of fail bit signal generator 152 can have a structure in which the transistor and the fuse are serially connected. Further, transistors Tc1 to Tc4, Td1 to Td4 operate according to the first repair enable signal RIOEN.

The plurality of the fuses Fc1 to Fc4, Fd1 to Fd4 included in the fail bit signal generator 152 are selectively cut (the cutting state of the fuse is not shown) depending on which bits corresponding to the fail cell are in error. Accordingly, information on which bit is a 'fail' (i.e., in error) is stored.

The fail bit signal generator 152 outputs the fail bit signals RIO[3:0] that inform which bit is in error, when the repair enable signals RIOEN and RIOENb are received. For example, if the first bit is a 'fail,' the fuses Fd1, Fc2, Fc3 and Fc4 are cut so that the fail bit signals RIO[3:0] are output as '0001'. This operation stores information regarding a fail bit (i.e., the location of a fail bit).

When information on the fail bit is stored, as the repair enable signals RIOEN and RIOENb are input, all the transistors Tc1 to Tc4, Td1 to Td4 are turned on. The power supply voltage or the ground voltage is transferred to the output terminal through fuses that are not cut, and the fail bit signal RIO[3:0] is output as '0001'.

The I/O multiplexer 160 of FIG. 1 outputs the repair data RDL originating from the redundancy array 120 to the pad PAD, replacing the data in error according to the fail bit signals RIO[3:0].

FIG. 3 is a simplified circuit diagram showing the I/O multiplexer shown in FIG. 1.

Referring to FIG. 3, 8 selectors 161 to 168 are included in the I/O multiplexer 160. 16 data bits DL0 to DL15 act as inputs to the selectors 161 to 168, respectively, in pairs. In the above example, if the circuit operates in 8-bit output mode, only 8 of the 16 data bits DL0 to DL15 are output from cell array 110. The selectors 161 to 168 operate according to an address signal (for example, referred to as "address bit An"), which is used to select the 8-bit output mode, located within the address signals A[n:0]. In the case of 8-bit output mode, the selectors 161 to 168 use only one of two possible data I/O lines (for example, 100 to 107), respectively.

As such, address bit An of the address signal A[n:0] is used in 8-bit output mode. Thus, fuses such as Fan and Fbn, which correspond to the address bit An, have to be properly cut in the address comparator 151 of FIG. 2.

In 16-bit output mode, since 16 data bits DL0 to DL15 are all used as inputs to the I/O multiplexer, the address bit An is not used to signify 8-bit output mode, and fuses such as Fan and Fbn corresponding to the address bit An are connected (i.e., not cut) so that the address bit An is disregarded. However, if the circuit is designed in 16-bit output mode, and fuses Fan and Fbn are all connected, the circuit cannot operate in 8-bit output mode. Accordingly, tests cannot be performed normally under an 8-bit output mode environment.

As a result, equipment capable of performing tests in a 16-bit output mode has to be additionally provided.

BRIEF SUMMARY OF THE INVENTION

Accordingly, the present invention has been made in view of the above problems, and it is an object of the present invention to provide a memory device capable of changing data output modes, wherein an address that is input to a circuit, which is designed in 8-bit output mode, is internally modified, to operate in 16-bit output mode, and a test operation is performed in 8-bit output mode, whereby two kinds of output mode circuits can be tested in one piece of test equipment, resulting in enhanced test efficiency and reduced cost.

To achieve the above object, in an embodiment of the present invention, a memory device includes an address comparator in which a fail address used to select a fail cell is stored on an 8-bit output mode basis, wherein the address comparator compares an address signal and the fail address, and generates a repair enable signal if the address signal and the fail address coincide with each other. The memory device further includes an address signal controller which transfers the address signal to the address comparator in 8-bit output mode, and transfers address bits, which are used only in the 8-bit output mode, among the address signal, as High level so that they are not compared in 16-bit output mode, according to an output mode decision signal and a 8-bit forced decision signal, and a fail bit signal generator that generates fail bit signals, which indicate to which bit of output data does fail data of the fail cell correspond, according to the repair enable signal, wherein although information on the fail address is stored on the basis of the 8-bit output mode, the memory device operates as the 8-bit output mode or the 16-bit output mode according to the output mode decision signal and the 8-bit forced decision signal.

In the above described embodiment, the address comparator includes a plurality of fuses, wherein the fuses are selectively cut so that the fail address is stored. The address comparator includes a first switching element, which is connected between a power supply voltage terminal and a first node (output node), and operates depending on a first enable signal, and a second switching element, which is connected to a ground voltage terminal and operates depending on a second enable signal. The address comparator further includes a plurality of switching units comprising a transistor and a fuse serially connected in pairs, such pairs connected in a parallel manner, where the plurality of the switching units are serially connected between the first switching element and the second switching element. The fuses of the switching units are selectively cut according to the fail address, and bits of the address signal are respectively input to the transistors of the switching units. In one embodiment, each transistor of the switching unit comprises an NMOS transistor. The first switching element comprises a PMOS transistor, and the second switching element comprises an NMOS transistor.

The address signal controller includes a first NAND gate configured to perform a NAND operation on an output mode decision signal and an inverted 8-bit forced decision signal, a second NAND gate configured to perform a NAND operation on an output signal of the first NAND gate and an address bit used to signify 8-bit output mode. In the 8-bit output mode, the second NAND gate simply produces an output which inverts the address bit (i.e., sets it from 1 to 0). In the 16-bit output mode, the second NAND gate produces an output bit set to High (e.g., 1). The address signal controller further includes an inverter configured to invert the output signal of the first NAND gate, and a NOR element configured to perform a NOR operation on the input address bit signal of the second NAND gate and the output signal of the inverter, thereby passing the address bit information to the address comparator in the 8-bit output mode, and setting the output bit to High in the 16-bit output mode.

The fail bit signal generator includes a switching element, which is connected between a power supply voltage terminal and a first node, and operates according to the repair enable signal, where the first to fourth switches are connected between the first node and first to fourth output terminals, and the fifth to eighth switches are connected between a ground voltage terminal and the first to fourth output terminals, each of the switches having a structure which corresponds to respective fuses (which are selectively cut depending on which bits of the output data are in error), and a transistor to which an inverted signal of the repair enable signal is input, wherein these components are connected in a serial manner. The switching element may comprise a PMOS transistor, and the transistor may comprise an NMOS transistor.

The memory device may further include a fail bit signal controller configured to output a most significant bit, which is related to the 16-bit output mode, and set the fail bit signal to Low (e.g., 0) according to the 8-bit forced decision signal if the output mode is the 8-bit output mode. The fail bit signal controller includes a transmitter that transmits the most significant bit when the 8-bit forced decision signal is set to 16-bit output mode. A switching element, which is connected between an output terminal of the transmitter and a ground voltage terminal, outputs the most significant bit as Low in the 8-bit output mode according to the 8-bit forced decision signal. The switching element may comprise an NMOS transistor.

Furthermore, the memory device can further include an I/O multiplexer which outputs the output data as 16 bits or 8 bits according to the address bit generated by the address signal controller, and outputs repair data of a redundancy array instead of the fail data corresponding to the fail bit signal.

In another embodiment of the present invention, a memory device includes a cell array comprising a plurality of cells configured to output data according to an address signal, a redundancy array including a plurality of repair cells configured to output repair data that will replace output data in error, and a fail bit detector in which a fail address used to select the fail cell is stored on an 8-bit output mode basis, wherein the fail bit detector compares the address signal and the fail address in the 8-bit output mode according to an output mode decision signal and an 8-bit forced decision signal. The memory device compares an address bit located within an address signal used to signify a 16-bit output mode with the fail address, thus outputting a fail bit signal which indicates which bits are in error. The memory device further includes an I/O multiplexer configured to output the repair data instead of the output data in error according to the fail bit signal, outputting 8 bits of data in the 8-bit output mode, and outputting 16 bits of data in the 16-bit output mode, wherein although information on the fail address is stored on the basis of the 8-bit output mode, the memory device operates as 8-bit output mode or 16-bit output mode according to the output mode decision signal and the 8-bit forced decision signal.

In the above embodiment, the fail bit detector includes an address comparator in which the fail address is stored on an 8-bit output mode basis, wherein the address comparator compares the address signal and the fail address, and generates a repair enable signal if the address signal and the fail address coincide with each other. The fail bit detector also includes an address signal controller, which transfers the address signal to the address comparator in the 8-bit output mode, and transfers address bits, which are used only in the 8-bit output mode, among the address signal, as High level so that the bits are not compared in the 16-bit output mode, according to the output mode decision signal and the 8-bit forced decision signal, and a fail bit signal generator that generates the fail bit signals, which indicate to which bit of the output data does the fail data of the fail cell correspond, according to the repair enable signal.

The address comparator, the address signal controller and the fail bit signal generator are provided to complement (i.e., match) the number of columns of the redundancy array.

The address comparator includes a plurality of fuses, wherein the fuses are selectively cut so that the fail address is properly stored.

The address comparator includes a first switching element, which is connected between a power supply voltage terminal and a first node (output node), and operates depending on a first enable signal, and a second switching element, which is connected to a ground voltage terminal and operates depending on a second enable signal. The address comparator further includes a plurality of switching units comprising a transistor and a fuse serially connected in pairs, such pairs connected in a parallel manner, where the plurality of the switching units are serially connected between the first switching element and the second switching element. The fuses of the switching units are selectively cut according to the fail address, and bits of the address signal are respectively input to the transistors of the switching units. Each transistor of the switching unit may comprise an NMOS transistor. The first switching element may comprise a PMOS transistor, and the second switching element may comprise an NMOS transistor.

The address signal controller includes a first NAND gate for performing a NAND operation on the output mode decision signal and an inverted 8-bit forced decision signal, a second NAND gate for performing a NAND operation on the output signal of the first NAND gate and the address bit, thereby inverting the address bit in the 8-bit output mode, and outputting the address bit as High level in the 16-bit output mode, an inverter for inverting the output signal of the first NAND gate, and a NOR element for performing a NOR operation on the output signal of the second NAND gate and the output signal of the inverter, thereby outputting the address bit in the 8-bit output mode and the address bit as High in the 16-bit output mode.

The fail bit signal generator includes a switching element, which is connected between a power supply voltage terminal and a first node, and operates according to the repair enable signal, first to fourth switches each connected between the first node and first to fourth output terminals, and fifth to eighth switches each connected between a ground voltage terminal and the first to fourth output terminals, wherein each of the switches has a structure which corresponds to respective fuses (which are selectively cut depending on which bits of the output data are in error), and a transistor to which an inverted signal of the repair enable signal is input, where these components are connected in a serial manner. The switching element may comprise a PMOS transistor, and the transistor may comprise an NMOS transistor.

The memory device may further include a fail bit signal controller configured to output a most significant bit, which is related to the 16-bit output mode, and set the fail bit signal to Low (e.g., 0) according to the 8-bit forced decision signal if the output mode is the 8-bit output mode. The fail bit signal controller includes a transmitter that transmit the most significant bit corresponding to the 8-bit forced decision signal. A switching element, which is connected between an output terminal of the transmitter and a ground voltage terminal, outputs the most significant bit as Low in the 8-bit output mode according to the 8-bit forced decision signal. The switching element may comprise an NMOS transistor.

DETAILED DESCRIPTION OF THE INVENTION

Several embodiments in accordance with the present invention will be described with reference to the accompanying drawings. It should be appreciated that the embodiments are provided for the purpose that one ordinarily skilled in the art would be able to understand the present invention, and modifications in various manners and the scope of the present invention are not limited by the embodiments described herein.

Figure 1:
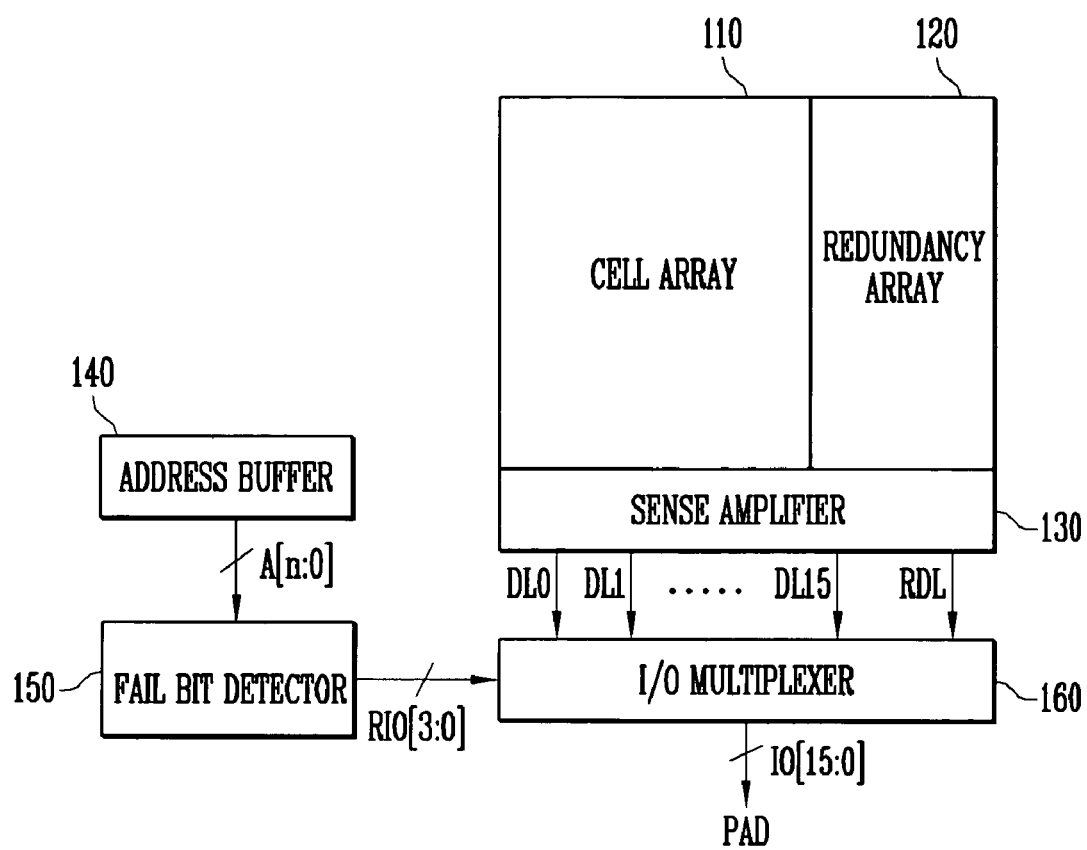
FIG. 1 is a simplified block diagram of a conventional memory device having a redundancy cell array.

A memory device capable of changing data output modes according to an embodiment of the present invention includes a cell array, a redundancy array, a sense amplifier, an address buffer, a fail bit detector and an I/O multiplexer. The present fail bit detector according to the present invention has different construction and operations than those of the fail bit detector 150 shown in FIG. 1.

Figure 4:
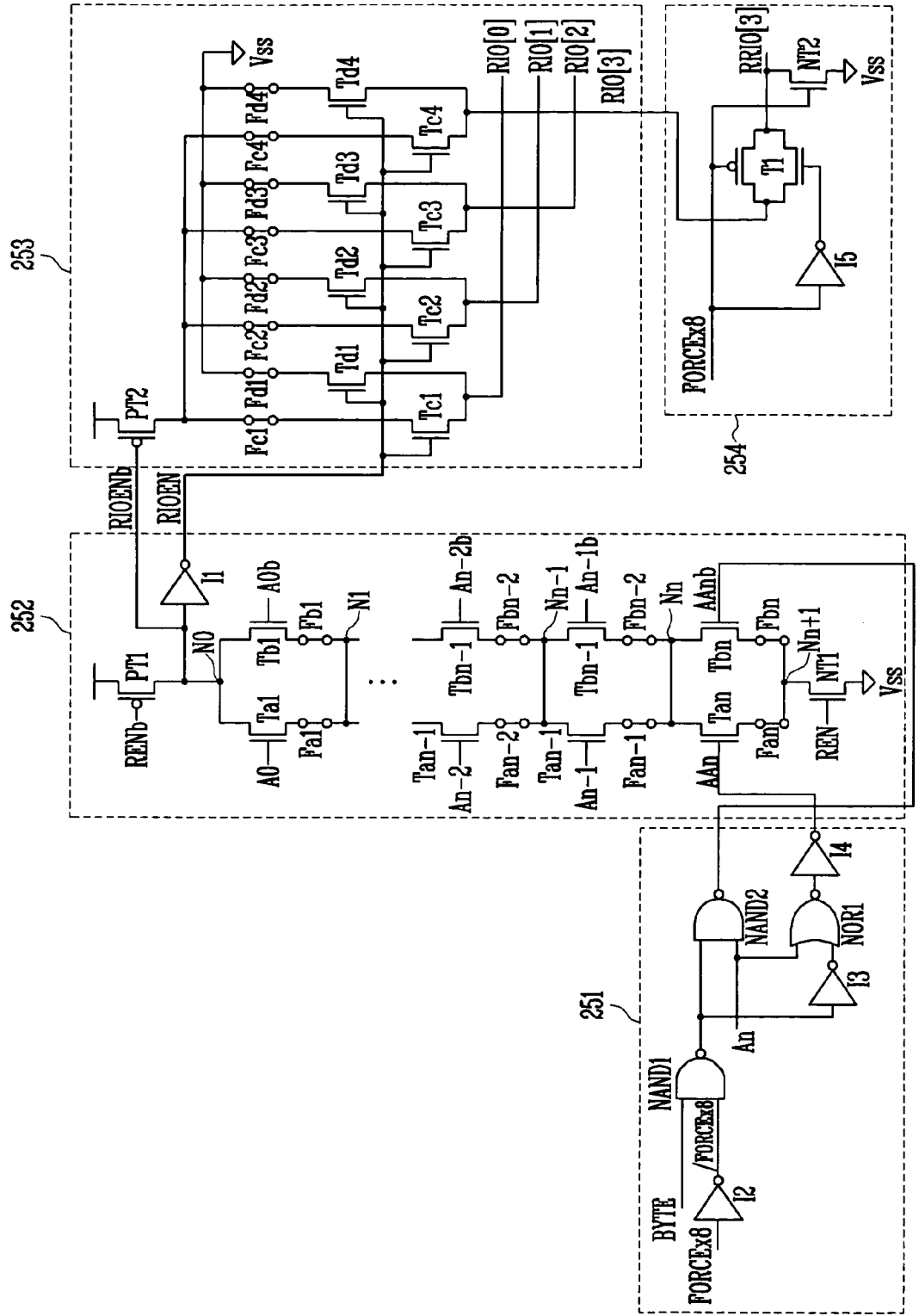
FIG. 4 is a simplified circuit diagram showing a fail bit signal generator according to an embodiment of the present invention.

FIG. 4 is a simplified circuit diagram showing a fail bit signal generator according to an embodiment of the present invention.

Referring to FIG. 4, the fail bit detector includes an address signal controller 251, an address comparator 252, a fail bit signal generator 253 and a fail bit signal controller 254. The components correspond to (i.e., match) the number of columns included in the redundancy array.

The address signal controller 251 includes a first NAND gate NAND1 configured to perform a NAND operation on an output mode decision signal BYTE and an inverted 8-bit forced decision signal /FORCEx8, and a second NAND gate NAND2 configured to perform a NAND operation on the output signal of the first NAND gate NAND1 and an address bit An used to specify an 8-bit output mode, where the output is of NAND2 is AAnb. Address signal controller 251 also includes an inverter I3 that inverts the output signal of the first NAND gate NAND1, where NOR elements NOR1 and I4 perform a NOR operation on the input signal An of the second NAND gate NAND2 and the output signal of the inverter I3 to produce an output bit AAn.

The address signal controller 251 logically combines the address bit An, which may not be used in a 16-bit output mode but may be used in an 8-bit output mode, with the output mode decision signal BYTE and the 8-bit forced decision signal FORCEx8 to output new address bits AAn and AAnb. In other words, the address signal controller 251 outputs the address bit AAn and the inverted address bit AAnb to signify whether the system is in 8-bit output mode or 16-bit output mode. In the 8-bit output mode, output bits AAn and AAnb correspond to address bit An. In 16-bit output mode, bits AAn and AAnb are output as High (e.g., 1).

Address signals A0 to An-1, AAn, A0$b$ to An-1$b$, and AAnb are input to the address comparator 252. The address comparator 252 generates repair enable signals RIOEN and RIOENb according to a cutting state of fuses Fa1 to Fan, and Fb1 to Fbn, if the address signals A0 to An-1, AAn, A0$b$ to An-1$b$, and AAnb coincide with the fail address. When this occurs, the fuses Fa1 to Fan, and Fb1 to Fbn are cut according to the 8-bit output mode regardless of the output mode.

Figure 2:
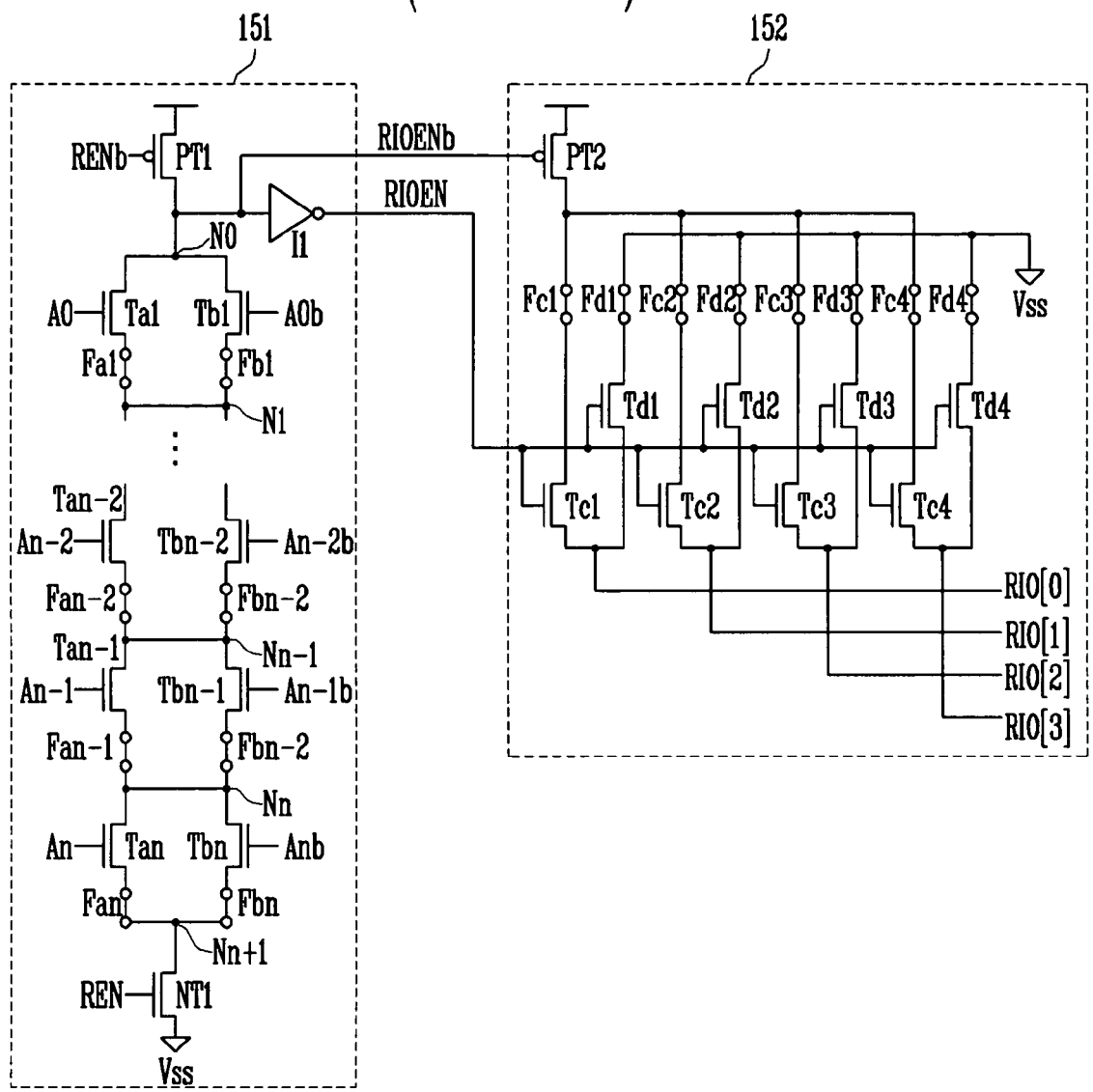
FIG. 2 is a simplified circuit diagram showing the fail bit detector shown in FIG. 1.
Figure 3:
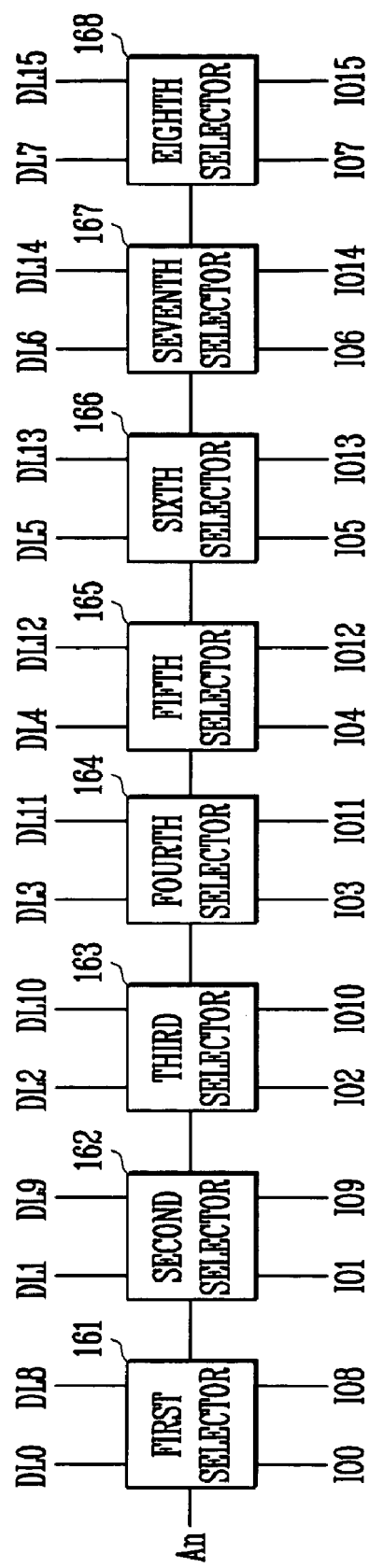
FIG. 3 is a simplified circuit diagram showing the I/O multiplexer shown in FIG. 1.

The construction and operation of the address comparator 251 are the same as those of the address comparator 151 shown in FIG. 2. Description thereof will be thus omitted.

The fail bit signal generator 253 outputs the fail bit signals RIO[3:0], which indicate which bits are in error, according to the repair enable signals RIOEN and RIOENb. The construction and operation of the fail bit signal generator 253 are the same as those of the fail bit signal generator 152 shown in FIG. 2. Description thereof will be thus omitted.

The fail bit signal controller 254 includes a transmitter T1 and I5 that transmit a most significant bit RIO[3] of the fail bit signals RIO[3:0] related to the 16-bit output mode according to the 8-bit forced decision signal FORCEx8. A switching element NT2 is connected between the output terminal of the transmitter T1 and I5 and a ground voltage terminal, setting the most significant bit RIO[3] to Low (e.g., 0) in an 8-bit output mode according to the 8-bit forced decision signal FORCEx8. Switching element N2 may be implemented using an NMOS transistor.

The fail bit signal controller 254 described above outputs the most significant bit RRIO[3] as the most significant bit RIO[3] in 16-bit output mode, while the most significant bit RRIO[3] is set to Low in 8-bit output mode.

The I/O multiplexer (160 in FIG. 1) outputs the repair data RDL of the redundancy array instead of outputting data that is in error, the RDL data corresponding to the fail bit signals RIO[2:0] and RRIO[3]. The I/O multiplexer also outputs the corrected output data originating from the cell array as 8 bits or 16 bits depending on the status of address bit An.

The operation of the memory device described above according to an embodiment of the present invention will now be described regarding specific output modes.

8-Bit Output Mode

The fuses Fa1 to Fan, Fb1 to Fbn included in the address comparator 252 are selectively cut corresponding to a fail address which is represented on an 8-bit output mode basis regardless of which output mode is selected. The selective cutting of the fuses store the fail address.

Address signals A[n-1:0] of the address signals A[n:0] are directly input to the address comparator 252. The address bit An used to signify 8-bit output mode is input to the address signal controller 251.

The address signal controller 251 operates according to the output mode decision signal BYTE and the 8-bit forced decision signal FORCE×8. In the 8-bit output mode, the output mode decision signal BYTE is input as Low (e.g., 0). When this occurs, the output mode decision signal BYTE comprises a signal fixed to a cutting state of an optional fuse (not shown). In one embodiment of the present invention, the output mode decision signal BYTE cannot be changed after packaging is completed. In other words, if the output mode decision signal BYTE is input as Low, the circuit operates in 8-bit output mode regardless of the 8-bit forced decision signal FORCE×8. Therefore, the address signal controller 251 outputs the address bit AAn as High and the address bit AAnb as Low when the address bit An is set to High. On the other hand, if the address bit An is set to Low, the address signal controller 251 outputs the address bit AAn as Low and the address bit AAnb as High.

The address comparator 252 compares the address signals A0 to An-1, AAn and the fail address. If the address signals and the fail address coincide with each other, the first node N0 (the output terminal) and the ground voltage terminal become electrically connected through the transistors, which are selectively turned on by the address signals A0 to An-1, AAn, A0b to An-1b and AAnb and the fuses that are not cut, so that the repair enable signals RIOEN and RIOENb are generated as predetermined levels, respectively (i.e., RIOENb is Low or 0 and RIOEN is High or 1).

The fail bit signal generator 253 generates the fail bit signals RIO[3:0] according to the repair enable signals RIOEN and RIOENb, and recognizes which bits of the output data are in error.

In this case, the most significant bit RIO[3] of the fail bit signals RIO[3:0] is controlled by the fail bit signal controller 254. The fail bit signal controller 254 outputs the most significant bit RRIO[3] and sets this bit RRIO[3] to Low depending on the 8-bit forced decision signal FORCE×8, where FORCE×8 is set to High to signify 8-bit output mode. In the system, the most significant bit RRIO[3] is set to Low because the data is output as 8 bits (i.e., only 3 bits are needed to represent 8 bits).

The I/O multiplexer (160 in FIG. 1) outputs repair data RDL of the redundancy array instead of outputting data in error, the repair data corresponding to fail bit signals RIO[2:0] and RRIO[3]. I/O multiplexer (160 in FIG. 1) outputs only 8 bits (i.e., DL0 to DL7) among the 16 available data bits DL0 to DL15, which are output from the cell array, according to address bit AAn which is output from the address signal controller 251.

16-bit Output Mode

In one embodiment of the present invention, a 16-bit output mode sets a circuit that is designed (fuse cut) on an 8-bit output mode basis to operate in 16-bit output mode.

Accordingly, the fuses Fa1 to Fan, Fb1 to Fbn included in the address comparator 252 are selectively cut corresponding to a fail address which is represented on an 8-bit output mode basis regardless of which output mode is selected. In this manner, a fail address is stored.

In one embodiment of the present invention, some address signals A[n-1:0] of the address signals A[n:0] are directly input to the address comparator 252. The address bit An that used to signify 8-bit output mode is input to the address signal controller 251.

The address signal controller 251 operates according to the output mode decision signal BYTE and the 8-bit forced decision signal FORCE×8. If output mode decision signal BYTE is set to High, a circuit operates in forced 8-bit output mode or 16-bit output mode depending on the 8-bit forced decision signal FORCE×8. When the 8-bit forced decision signal FORCE×8 is set to Low, the circuit operates in 16-bit output mode. Accordingly, the address signal controller 251 outputs both bits AAn and AAnb as High regardless of the status of address bit An.

The logically combined address bits AAn and AAnb are respectively input to the transistors Tan and Tbn included in the switching unit of the address comparator 252. Both address bits AAn and AAnb are set to High, and the $(n+1)^{th}$ node Nn and the $n^{th}$ node Nn−1 are electrically connected to each other unconditionally. In other words, the cutting state of the fuses Fan and Fbn is disregarded because the address bits AAn and AAnb input as High regardless of the address bit An. Thus, the address signals A0 to An-1 and the fail address are compared on a 16-bit output mode basis.

The address comparator 252 compares the address signals A0 to An-1, AAn, and the fail address. If the address signals A0 to An-1, AAn, and the fail address coincide with each other, the first node N0 (the output terminal) and the ground voltage terminal become electrically connected through the transistors, which are selectively turned on by the address signals A0 to An-1, AAn, A0b to An-1b, AAnb and the fuses that are not cut, so that the repair enable signals RIOEN and RIOENb are both generated at predetermined levels, respectively (i.e., RIOENb is Low or 0 and RIOEN is High or 1).

The fail bit signal generator 253 generates the fail bit signals RIO[3:0] according to the repair enable signals RIOEN and RIOENb, and recognizes which bits of the output data are in error.

In one embodiment, the most significant bit RIO[3] of the fail bit signals RIO[3:0] is controlled by the fail bit signal controller 254. The fail bit signal controller 254 takes the most significant bit RIO[3] and outputs it as the most significant bit RRIO[3] depending on the 8-bit forced decision signal FORCE×8, where FORCE×8 is set to Low to signify 16-bit output mode.

The I/O multiplexer (160 in FIG. 1) outputs the repair data RDL of the redundancy array instead of outputting data in error, the repair data corresponding to the fail bit signals RIO[2:0] and RRIO[3]. In addition, the I/O multiplexer (160 in FIG. 1) outputs all the 16 data bits DL0 to DL15, which are output from the cell array, according to the address bit AAn generated from the address signal controller 251.

Forced 8-Bit Output Mode

Forced 8-bit output mode is a mode which allows a circuit operating in 16-bit output mode to be tested in 8-bit output mode.

In this particular embodiment, although the output mode decision signal BYTE is input as High to indicate 16-bit output mode, the 8-bit forced decision signal FORCE× 8overrides the output mode decision signal BYTE when FORCE×8 is set to High. Thus, the circuit operates in 16-bit output mode, and can be tested in 8-bit output mode. In one embodiment, since the output mode decision signal BYTE is decided through an optional fuse, it cannot be changed after packaging is completed. Accordingly, the output mode may be changed using the 8-bit forced decision signal FORCE×8.

The fuses Fa1 to Fan, Fb1 to Fbn included in the address comparator 252 are selectively cut corresponding to a fail address which is represented on an 8-bit output mode basis regardless of which output mode is selected. The selective cutting of the fuses store the fail address.

Some address signals A[n-1:0] of the address signals A[n:0] are directly input to the address comparator 252. The address bit An used to signify 8-bit output mode is input to the address signal controller 251.

The address signal controller 251 operates according to the output mode decision signal BYTE and the 8-bit forced decision signal FORCE×8. In 16-bit output mode, the output mode decision signal BYTE is input as High. However, the 8-bit forced decision signal FORCE×8 may override the output decision signal BYTE. When FORCE×8 is set to High, the circuit operates in 8-bit output mode. Accordingly, the address signal controller 251 outputs the address bit AAn as High and the address bit AAnb as Low, if the address bit An is High. On the other hand, if the address bit An is Low, the address signal controller 251 outputs the address bit AAn as Low, and outputs the address bit AAnb as High.

The logically combined address bits AAn and AAnb are respectively input to the transistors Tan and Tbn included in the switching unit of the address comparator 252. Although the output mode is in 16-bit output mode, address bits AAn and AAnb are set to the same level as those of address bits An and Anb, when operating in 8-bit output mode.

The address comparator 252 compares the address signals A0 to An-1, AAn, and the fail address. If the address signals A0 to An-1, AAn, and the fail address coincide with each other, the first node N0 (the output terminal) and the ground voltage terminal become electrically connected through the transistors, which are selectively turned on by the address signals A0 to An-1, AAn, A0b to An-1b, AAnb, and the fuses that are not cut, so that the repair enable signals RIOEN and RIOENb are generated as predetermined levels, respectively (i.e., RIOENb is Low or 0 and RIOEN is High or 1).

The fail bit signal generator 253 outputs the fail bit signals RIO[3:0] according to the repair enable signals RIOEN and RIOENb, and recognizes which bits of the output data are in error.

In one embodiment, the most significant bit RIO[3] of the fail bit signals RIO[3:0] is controlled by the fail bit signal controller 254. The fail bit signal controller 254 outputs the most significant bit RRIO[3] and sets this bit to Low depending on the 8-bit forced decision signal FORCE×8, where FORCE×8 is set to High to signify 8-bit output mode. In the system, the most significant bit RRIO[3] is set to Low because the data is output as 8 bits (i.e., only 3 bits are needed to represent 8 bits).

The I/O multiplexer (160 in FIG. 1) outputs the repair data RDL of the redundancy array instead of outputting data in error, the repair data corresponding to the fail bit signals RIO[2:0] and RRIO[3]. In addition, the I/O multiplexer (160 in FIG. 1) outputs only 8 bits of data (for example, DL0 to DL7) among the 16 data bits DL0 to DL15, which are output from the cell array, according to the address bit AAn generated from the address signal controller 251.

As such, the circuit operating in 16-bit output mode can be made to operate in 8-bit output mode using the 8-bit forced decision signal FORCE×8.

As described above, according to the present invention, an address that is input to a circuit, which is designed as 8-bit output mode, is internally modified, to operate as 16-bit output mode, and a test operation is performed in 8-bit output mode. As such, two kinds of output mode circuits can be tested in one test equipment. Accordingly, test efficiency can be enhanced and the cost can be saved.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A memory device, comprising:
   an address comparator in which a fail address used to select a fail cell is stored on an 8-bit output mode basis, wherein the address comparator compares an address signal and the fail address, and generates a repair enable signal if the address signal and the fail address coincide with each other;
   an address signal controller which transfers the address signal in entirety to the address comparator in the 8-bit output mode, and transfers address bits of the address signal that are used only in the 8-bit output mode as a given logic value, so that the transferred address bits are not compared in a 16-bit output mode according to an output mode decision signal and a 8-bit forced decision signal; and
   a fail bit signal generator that generates fail bit signals that indicate to which bit of output data does fail data of the fail cell correspond according to the repair enable signal,
   wherein although information on the fail address is stored on the 8-bit output mode basis, the memory device is configured to operate as the 8-bit output mode or the 16-bit output mode according to the output mode decision signal and the 8-bit forced decision signal.

2. The memory device of claim 1, wherein the address comparator includes a plurality of fuses, wherein the fuses are selectively cut so that the fail address is stored, wherein the given logic value is High.

3. The memory device of claim 1, wherein the address comparator comprises:
   a first switching element, which is connected between a power supply voltage terminal and a first node being an output node, and is configured to operate according to a first enable signal;
   a second switching element, which is connected to a ground voltage terminal and configured to operate according to a second enable signal; and
   a plurality of switching units in which a node and a switch component in which a transistor and a fuse are serially connected are connected in a parallel manner, the plurality of the switching units being serially connected between the first switching element and the second switching element,
   wherein the fuses are selectively cut according to the fail address, and bits of the address signal are input to the transistors included in the switching units, respectively, wherein the given logic value is High.

4. The memory device of claim 3, wherein the transistor of the switch component comprises an NMOS transistor.

5. The memory device of claim 3, wherein the first switching element comprises a PMOS transistor, and the second switching element comprises an NMOS transistor.

6. The memory device of claim 1, wherein the address signal controller comprises:
   a first NAND gate configured to perform a NAND operation on the output mode decision signal and an inverted 8-bit forced decision signal;
   a second NAND gate configured to perform a NAND operation on the output signal of the first NAND gate and one of the address bits, thereby inverting the address bit in the 8-bit output mode, and outputting the address bit with the given logic value in the 16-bit output mode;

an inverter configured to invert the output signal of the first NAND gate; and a NOR element configured to perform a NOR operation on the address bit input signal of the second NAND gate and the output signal of the inverter, the output of the NOR element passing the address bit information in entirety in the 8-bit output mode and the output being set to High in the 16-bit output mode.

7. The memory device of claim 1, wherein the fail bit signal generator comprises:

a switching element, which is connected between a power supply voltage terminal and a first node, and operates according to the repair enable signal;

first to fourth switching components each connected between the first node and first to fourth output terminals; and fifth to eighth switching components each connected between a ground voltage terminal and the first to fourth output terminals, wherein each of the switching components has a structure in which fuses are selectively cut depending on which bits of the output data correspond to the fail data, and each of the switching components comprises a transistor which receives an inverted signal of the repair enable signal, wherein the switching element, the first to fourth switching components, and the fifth to eighth switching components are connected in a serial manner.

8. The memory device of claim 7, wherein the switching element is a PMOS transistor, and each transistor of the switching components comprises an NMOS transistor.

9. The memory device of claim 1, further comprising a fail bit signal controller configured to take a most significant bit of the fail signal, and produce an output when in 16-bit output mode, wherein the output of the most significant bit is set to Low when the 8-bit forced decision signal is set to 8-bit output mode.

10. The memory device of claim 9, wherein the fail bit signal controller comprises:

a transmitter that transmits the most significant bit of the fail signal according to the 8-bit forced decision signal; and a switching element, which is connected between an output terminal of the transmitter and a ground voltage terminal, and outputs the most significant bit as Low in the 8-bit output mode according to the 8-bit forced decision signal.

11. The memory device of claim 10, wherein the switching element is an NMOS transistor.

12. The memory device of claim 1, further comprising an I/O multiplexer which outputs the output data as 16 bits or 8 bits according to an address bit generated by the address signal controller, and outputs repair data of a redundancy array instead of outputting fail data according to the fail bit signal.

13. A memory device, comprising:

a cell array including a plurality of cells, configured to output data according to an address signal;

a redundancy array including a plurality of repair cells, configured to output repair data that will replace fail data output from a fail cell of the cell array according to the address signal;

a fail bit detector in which a fail address used to select the fail cell is stored according to a first output mode, wherein the fail bit detector compares the address signal and the fail address in the first output mode according to an output mode decision signal and an m-bit forced decision signal, and compares an address bit located within an address signal used to signify a second output mode with the fail address, thus outputting a fail bit signal which indicates which bits are in error; and an I/O multiplexer configured to output the repair data instead of the fail data according to the fail bit signal, and output m bits of data in the first output mode, and output n bits of data in the second output mode, wherein information on the fail address is stored according to the first output mode, and the memory device is configured to operate in the first output mode or the second output mode according to the output mode decision signal and the m-bit forced decision signal.

14. The memory device of claim 13, wherein the fail bit detector comprises:

an address comparator in which the fail address is stored according to the first output mode, wherein the address comparator compares the address signal and the fail address, and generates a repair enable signal if the address signal and the fail address correspond to each other;

an address signal controller, which transfers the address signal in entirety to the address comparator in the first output mode, and transfers address bits that are used only in the first output mode, among the address signal, the transferred address bits being set to a given logic value so that the address bits are not compared in the second output mode according to the output mode decision signal and the m-bit forced decision signal; and a fail bit signal generator that uses the repair enable signal to generate fail bit signals, which indicate which bits of the output data correspond to the fail data of the fail cell.

15. The memory device of claim 14, wherein the first output mode is an 8-bit output mode and the second output mode is a 16-bit comparator, the address signal controller, and the fail bit signal generator are provided to match the number of columns of the redundancy array.

16. The memory device of claim 14, wherein the address comparator includes a plurality of fuses, wherein the fuses are selectively cut so that the fail address is stored.

17. The memory device of claim 14, wherein the address comparator comprises:

a first switching element, which is connected between a power supply voltage terminal and a first node being an output node, and operates according to a first enable signal;

a second switching element, which is connected to a ground voltage terminal and operates according to a second enable signal; and a plurality of switching units in which a first switch and a second switch in which a transistor and a fuse are serially connected are connected in a parallel manner, the plurality of the switching units being serially connected between the first switching element and the second switching element, wherein the fuses are selectively cut according to the fail address, and bits of the address signal are respectively input to the transistors of the switching units.

18. The memory device of claim 17, wherein each transistor of the switching units comprises an NMOS transistor.

19. The memory device of claim 17, wherein the first switching element comprises a PMOS transistor, and the second switching element comprises an NMOS transistor.

20. The memory device of claim 14, wherein the address signal controller comprises:
- a first NAND gate configured to perform a NAND operation on the output mode decision signal and an inverted 8-bit forced decision signal;
- a second NAND gate configured to perform a NAND operation on the output signal of the first NAND gate and the address bit used to signify the first output mode, thereby inverting the address bit in the first output mode, and outputting the address bit as High in the second output mode;
- an inverter configured to invert the output signal of the first NAND gate; and
- a NOR element configured to perform a NOR operation on the input address bit signal of the second NAND gate and the output signal of the inverter, the output of the NOR element directly passing the address bit information to the address comparator in the first output mode and the output of the NOR element being set to High in the second output mode.

21. The memory device of claim 14, wherein the fail bit signal generator comprises:
- a switching element, which is connected between a power supply voltage terminal and a first node, and operates according to the repair enable signal;
- first to fourth switches each connected between the first node and first to fourth output terminals; and
- fifth to eighth switches each connected between a ground voltage terminal and the first to fourth output terminals, wherein each of the switches has a structure in which fuses are selectively cut depending on which bits of the output data are in error, and each of the switches comprises a transistor which receives an inverted signal of the repair enable signal,
- wherein the switching element, the first to fourth switches, and the fifth to eighth switches are connected in a serial manner.

22. The memory device of claim 21, wherein the switching element comprises a PMOS transistor, and the transistor of the switches comprises an NMOS transistor.

23. The memory device of claim 14, further comprising a fail bit signal controller configured to output a most significant bit of the second output mode, wherein the most significant bit is set to Low when the m-bit forced decision signal is set to the first output mode.

24. The memory device of claim 23, wherein the fail bit signal controller comprises:
- a transmitter that transmits the most significant bit of the fail signal according to the m-bit forced decision signal; and
- a switching element, which is connected between an output terminal of the transmitter and a ground voltage terminal, and outputs the most significant bit as Low in the first output mode according to the m-bit forced decision signal.

25. The memory device of claim 24, wherein the switching element is an NMOS transistor.

* * * * *